United States Patent
Leong et al.

(10) Patent No.: US 7,618,857 B2
(45) Date of Patent: Nov. 17, 2009

(54) METHOD OF REDUCING DETRIMENTAL STI-INDUCED STRESS IN MOSFET CHANNELS

(75) Inventors: Meikei Leong, Wappinger Falls, NY (US); Qiqing C. Ouyang, Yorktown Heights, NY (US); Chun-Yung Sung, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 353 days.

(21) Appl. No.: 11/623,935

(22) Filed: Jan. 17, 2007

(65) Prior Publication Data

US 2008/0171413 A1     Jul. 17, 2008

(51) Int. Cl.
*H01L 21/8238*     (2006.01)
(52) U.S. Cl. ................ 438/224; 438/296; 438/424; 257/E21.546
(58) Field of Classification Search ............... 438/199, 438/218, 219, 221, 223–228, 294–297, 400, 438/424, 425, 439, 248, 318, 353, 355, 359, 438/404; 257/E21.54, E21.545, E21.546, 257/E21.561, E21.628, E21.642, 374, 501, 257/506, E21.426
See application file for complete search history.

(56) References Cited

U.S. PATENT DOCUMENTS

| | | | | |
|---|---|---|---|---|
| 5,770,504 | A * | 6/1998 | Brown et al. ............... | 438/296 |
| 5,994,756 | A * | 11/1999 | Umezawa et al. ........... | 257/510 |
| 6,764,921 | B2 * | 7/2004 | Imade et al. ................ | 438/424 |
| 2002/0076915 | A1 * | 6/2002 | Begley et al. .............. | 438/618 |
| 2004/0063299 | A1 * | 4/2004 | Imade et al. ................ | 438/424 |
| 2005/0085038 | A1 * | 4/2005 | Tu ............................. | 438/257 |
| 2005/0106833 | A1 * | 5/2005 | Oyamatsu et al. .......... | 438/400 |

\* cited by examiner

*Primary Examiner*—Matthew C Landau
*Assistant Examiner*—Joseph C Nicely
(74) *Attorney, Agent, or Firm*—Scully, Scott, Murphy & Presser, P.C.; Vazken Alexanian

(57) ABSTRACT

A method for reducing STI processing induced stress on a substrate during fabrication of a MOSFET. The method includes providing a substrate, wells (including dopants), and STIs in an upper layer of the substrate. A layer of an oxide substance is formed on a top surface of the upper layer of the substrate covering the STIs. A layer of a nitride substance is formed over the oxide layer. The substrate is annealed using temperatures greater than 1000° C. to activate the dopants in the wells which results in less stress on the STIs and hence less stress in the channels because of the nitride substance layer. The nitride and oxide substance layers are then stripped off the substrate, and CMOS fabrication is continued. The low stress remains in the channels if the thermal budget in following processes are low by using low temperature RTA and/or laser anneal.

16 Claims, 2 Drawing Sheets

400# METHOD OF REDUCING DETRIMENTAL STI-INDUCED STRESS IN MOSFET CHANNELS

FIELD OF THE INVENTION

This invention relates to a method for reducing shallow-trench-isolation-induced stress during fabricating complementary metal-oxide semiconductors (CMOS) devices, and more particularly, complementary metal-oxide-semiconductor field-effect transistors (MOSFETs).

BACKGROUND OF THE INVENTION

Complementary metal-oxide semiconductors (CMOS), are a major class of integrated circuits (IC). CMOS chips include microprocessors, microcontrollers, static RAM, and other digital logic circuits and RF/analog circuits.

Generally CMOS processing includes forming multiple shallow trench isolation (STI) regions in a top layer of a substrate. The STI regions are typically formed so as to isolate, for example, a device region in a silicon on insulator (SOI) or bulk substrate, from another device region. A plurality of wells, e.g. p-wells, n-wells, can also be formed in the device region. For example, a p-well is formed of p-type semiconductor material, and an n-well is formed of n-type semiconductor material. The p-well and n-well regions are formed utilizing processing steps that are known to those skilled in the art including, for example, trench definition and etching, optionally lining the trench with a diffusion barrier, and filling the trench with a trench dielectric such as an oxide. After the trench fill, the structure may be planarized and an optional densification process step may be performed to densify the trench dielectric.

More specifically, the device region is processed utilizing conventional block mask techniques. A block mask that can be used in forming a device region can comprise a conventional soft and/or hard mask material and it can be formed using deposition, photolithography and etching. For example, the block mask can comprise a photoresist. A photoresist block mask can be produced by applying a blanket photoresist layer to the substrate surface, exposing the photoresist layer to a pattern of radiation, and then developing the pattern into the photoresist layer utilizing conventional resist developer.

Alternatively, the block mask can be a hard mask material. Hard mask materials include dielectrics that may be deposited by chemical vapor deposition (CVD) and related methods. Typically, the hard mask composition includes silicon oxides, silicon carbides, silicon nitrides, silicon carbonitrides, etc. Spin-on dielectrics may also be utilized as a hard mask material including but not limited to: silsesquioxanes, siloxanes, and boron phosphate silicate glass (BPSG).

An device region (wells) may be formed by selectively implanting p-type or n-type dopants into the semiconductor layer. It is noted that the n-type device region is typically used when a pFET channel is to be subsequently formed, while a p-type device region is typically used when an nFET channel is to be subsequently formed.

In the state of the art complementary metal-oxide semiconductor (CMOS) technologies, shallow trench isolation induces stress in a channel area of a device region which in most cases degrades the drive current. A cause of performance degradation of the drive current is the mobility degradation due to local stress. The amount of stress is sensitive to the size of the device region and the distance between the channel and a shallow trench isolation (STI) edge, in other words, sensitive to the device layout. In addition, the stress induced by STI is a component of undesirable narrow width effect. Currently, various oxides and nitrides are used on STI regions. However, for example, oxide, nitride and silicon, have different thermal expansion coefficients, and thus it is difficult to control the stress or minimize the harmful stress.

It would therefore be desirable to enhance performance of a CMOS chip/wafer and also reduce the process-induced variations without significantly increasing the cost of manufacturing.

SUMMARY OF THE INVENTION

In the present invention, a method of reducing stress induced by shallow trench isolation (STI) during MOSFET fabrication in a complementary metal-oxide semiconductor fabrication (CMOS) process is disclosed. In addition, this method also utilizes rapid thermal annealing (RTA) and laser annealing to form a shallower source/drain junction, which is necessary for advanced complementary metal-oxide semiconductors (CMOS) device scaling. The process according to the present invention is compatible with conventional CMOS fabrication techniques. A nitride cap is deposited before an n-well and/or p-well annealing to activate the dopants in the respective N and/or P wells. During the anneal, the nitride cap is expected to minimize the thermal expansion from STI, hence less stress is introduced into the silicon active regions. This state of lower stress will be retained or "memorized" by the STI and the surrounding Si device areas, as long as there is no subsequent high temperature anneal performed afterwards.

In one aspect of the present invention, a method for reducing STI (shallow trench isolation) processing induced stress on a substrate during CMOS (complementary metal-oxide semiconductor) semiconductor fabrication of a MOSFET (complementary metal-oxide-semiconductor field-effect transistor) comprises providing at least one doped semiconductor well including dopants of a conductivity type in an upper layer of the substrate. At least two STIs in the upper layer of the substrate having one well therebetween are also provided. A first layer of a dielectric material (e.g., an oxide) is deposited on a top surface of the upper layer of the substrate covering the STIs. A second dielectric material (e.g., a nitride) is further deposited over the first (oxide) dielectric layer. The substrate is annealed including the at least one well in the upper layer of the substrate using temperatures greater than 1000° C. to activate the dopants in the at least one well resulting in less stress in the STIs because of the second nitride layer. The nitride and oxide substance layers are stripped off the top surface of the substrate to expose the STIs having already been subject to stress forces from the annealing step. A gate structure having a conductive layer and gate dielectric is formed and patterned over the top surface of the substrate. A re-oxide layer is formed using deposition techniques over the gate conductor material structure, e.g., using a low temperature oxide.

In a related aspect of the invention, annealing of the at least one well includes rapid thermal annealing (RTA), and may also include furnace annealing.

In another related aspect of the invention, the gate dielectric layer includes an oxide, oxynitride, nitride, any high-k dielectrics (such as HfO2), singly or in combination.

In another related aspect of the invention, the patterned gate conductive layer includes a silicon containing material, e.g., polysilicon, being in situ doped during polysilicon deposition or, doped by implants.

In another related aspect of the invention, the reoxide includes a low temperature oxide or a low temperature nitride.

In another related aspect of the invention, the gate conductor material structure is polysilicon, polySiGe, fully silicided or containing metal such as TiN, including FUSI and a metal/highk gate.

In another related aspect of the invention the method further comprises implanting halo implants and an extension in the upper layer of the substrate. A spacer is formed adjacent to the gate structure using a low temperature (between 400-500° C.) process. A source and a drain are implanted in the upper level of the substrate with the gate structure therebetween. The substrate is annealed using low-temperatures (below 700° C.). The substrate is further laser annealed, and silicide formation is provided, whereby a CMOS semiconductor is fabricated.

In another related aspect of the invention, the spacer formation includes PECVD nitride deposition.

In another related aspect of the invention the silicide formation includes using Co or Ni in the temperature range of 300°-500° C.

In another related aspect of the invention the re-oxide layer includes a high pressure and high gas flow rate process with slot plane antenna (SPA) plasma.

In another related aspect of the invention the re-oxide layer is formed using a low-temp (between 400-500° C.) nitride deposition technique.

In another related aspect of the invention the substrate includes a plurality of STIs and a plurality of wells positioned between the STIs.

In another related aspect of the invention the method further comprises forming a first nitride spacer using a low temperature (between 400-500° C.) process, and implanting a source and a drain in the upper level of the substrate with the gate conductor material structure therebetween. The substrate is annealed using low-temperatures (below 700° C.). The nitride spacer is removed, and halo implants and an extension are implanted in the upper layer of the substrate. A second nitride spacer is formed using a low temperature (between 400-500° C.) process. The substrate is laser annealed, and a silicide formation is provided, whereby a CMOS semiconductor is fabricated.

In another related aspect of the invention, the first and second spacer formations include a PECVD nitride deposition process.

BRIEF DESCRIPTION OF THE DRAWINGS

These and other objects, features and advantages of the present invention will become apparent from the following detailed description of illustrative embodiments thereof, which is to be read in connection with the accompanying drawings, in which.

DETAILED DESCRIPTION OF THE INVENTION

Figure 1:
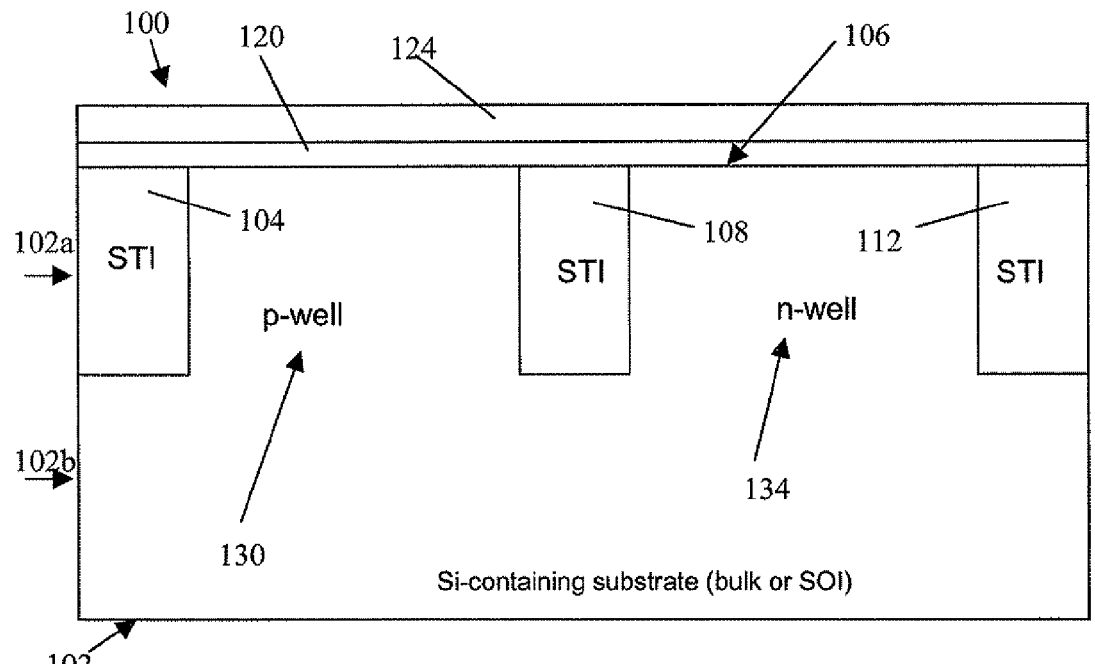
FIG. 1 is a cross-sectional view of a silicon wafer including shallow trench isolation (STI) regions.
Figure 2:
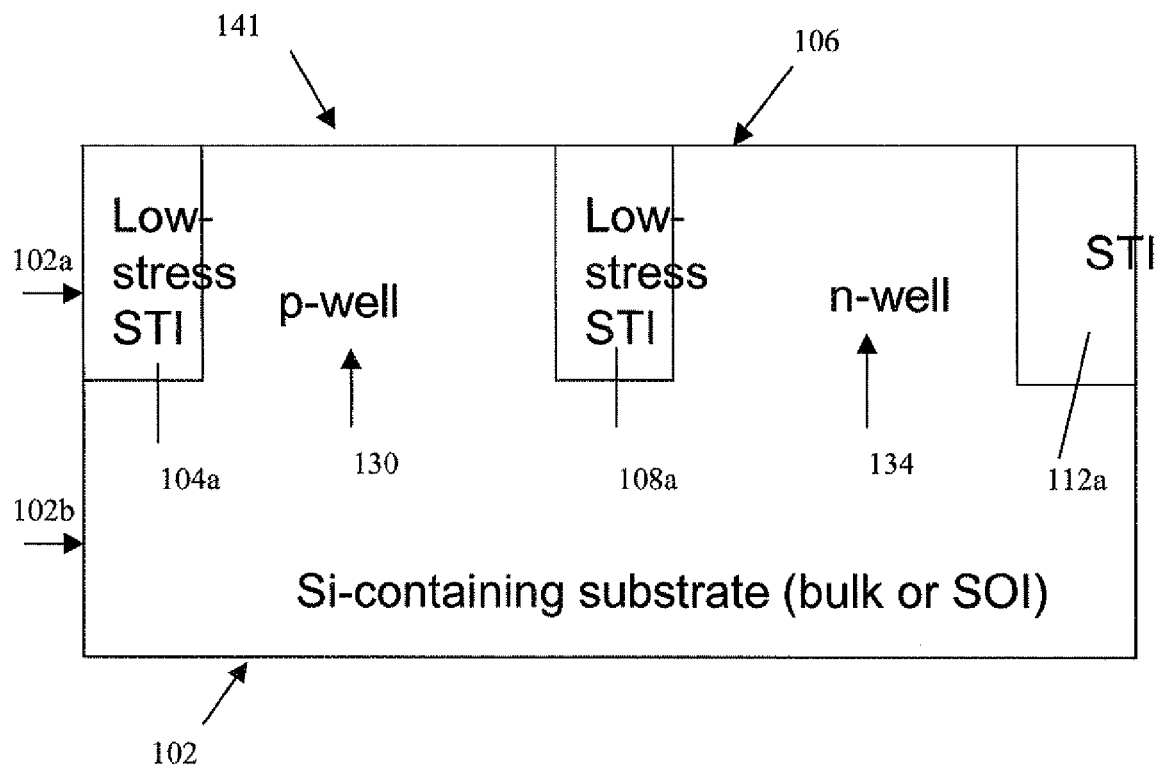
FIG. 2 is a cross-sectional view of the silicon wafer show in FIG. 1 after annealing the wafer and stripping off top layers.
Figures 3, 4:
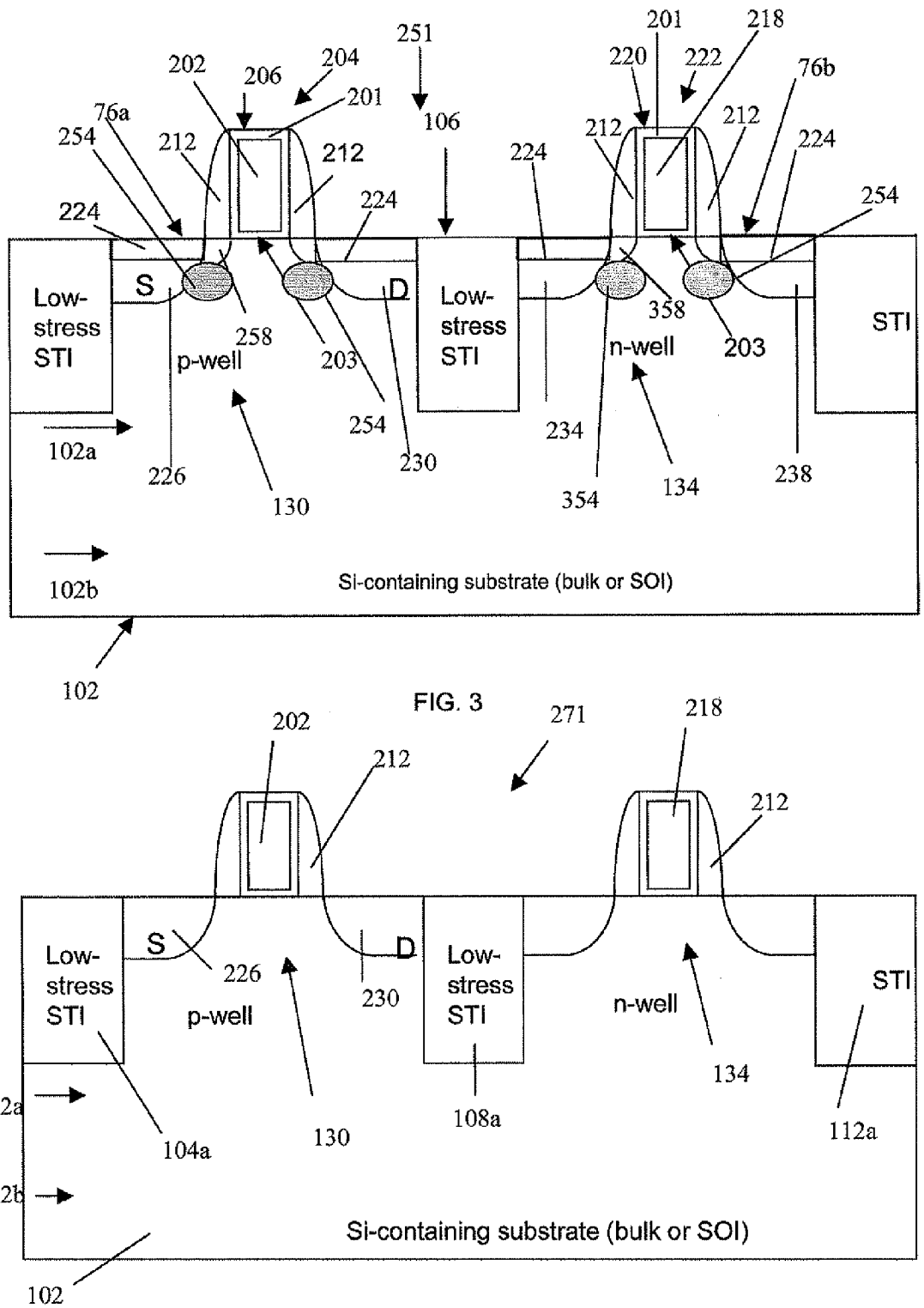
FIG. 3 is a cross-sectional view of the processed silicon wafer shown in FIGS. 1 and 2 according to a first and second embodiment of the invention.
FIG. 4 is a cross-sectional view of the silicon wafer shown in FIGS. 1 and 2 according to a second embodiment of the invention.

A first embodiment of the method according to the present invention is depicted in FIGS. 1-3 for reducing detrimental STI-induced stress in MOSFET channels during their fabrication. Referring to FIG. 1, a substrate 102 can be, for example, a bulk wafer or SOI, or a substrate comprising silicon, such as SOI (silicon on insulator), bulk silicon, Silicon Germanium-on-insulator (SGOI), Strained silicon directly on insulator (SSDOI).

The top surface 106 of the substrate 102 is typically cleaned before the process begins to remove any residual layers (e.g., native oxide), foreign particles, and any residual metallic surface contamination and to temporarily protect the cleaned substrate surface. Any residual silicon oxide is first removed, for example, in a solution of hydrofluoric acid.

Referring to FIG. 1, first formed on the substrate 102 are shallow trench isolation (STI) regions 104, 108, 112, then p-well 130, and n-well 134 regions. The STI regions are typically formed of insulator materials such as an oxide (e.g., $SiO_2$), nitride or oxynitride and isolate one device region from another device region. A p-well 130 SOI device region is shown between STI 104 and STI 108, and an n-well 134 SOI device region is shown between STI 108 and STI 112. The STI 104, 108 and 112 regions are formed utilizing processing steps that are known to those skilled in the art including, for example, trench definition and etching, optionally lining the trench with a diffusion barrier, and filling the trench with a trench dielectric such as an oxide. The pwell 130m and n-well 134 are formed using ion implantation. A layer of screening oxide 120 (or another oxide substance) is deposited on a top surface 106 of the upper layer 102a of the substrate 102 which includes the STIs 104, 108, 112 A layer of nitride or a nitride cap 124 (or another nitride substance) is deposited over the screening oxide 120.

After the implantation of the p-well 130 and n-well 134 regions, the regions are activated using a conventional annealing process such as a furnace anneal or a rapid thermal anneal. Thus, the post annealing substrate 102 includes a p-well (including dopants, for example, boron) 130, and an n-well (including dopants, for example, phosphorous) 134 in an upper layer 102a of the substrate 102. Further, the STIs 104, 108, 112 formed in the upper layer 102a of the substrate 102 have the p-well 130 and the n-well 134 therebetween.

The annealing process of the substrate 102 including the wells 130, 134 is applied at temperatures greater than 1000° C. to activate the dopants in the wells 130, 134, and results in less stress in the STIs 104a, 108a, 112a, and surrounding silicon regions, 130 and 134 shown in FIGS. 2-4, because of the nitride substance layer or cap 124. The annealing of the substrate may include rapid thermal annealing (RTA), or furnace annealing. The "stress stage" caused by the anneal is "memorized" and will not change unless a high thermal budget is used in a subsequent process. After the anneal, in order to maintain low stress on the STI, only low temperature annealing or laser annealing can be used in subsequent processes. Thus, the layer of screening oxide 120 is deposited on the top surface 106 of the substrate 102, and a layer of nitride 124 (nitride cap) is layered over the screening oxide 120 to minimize stress formation during the annealing step of the CMOS process.

Further, during the annealing process step, the nitride cap 124 minimizes the thermal expansion of the STI regions 104, 108, 112, hence less stress is induced in the silicon active regions 76a, 76b, shown in FIG. 3. The reduction in stress minimizes the process induced variation of stress in the silicon active regions. The process of depositing a screening oxide 120 between the nitride cap 124 and the silicon substrate 102 avoids creating stress in the underlying silicon if the nitride is deposited directly on the silicon. The silicon substrate 102 undergoes reduced stress by applying the method of the present invention during the MOSFET fabrication process. The state of the stress on the silicon substrate 102 remains the same or is "memorized" by the STIs 104, 108, 112 resulting in STIs 104a, 108a, 112a having been subjected to less stress.

Referring to FIG. 2, the nitride cap 124 and the screening oxide 120 substance layers have been stripped off the top surface 106 of the substrate 102 to provide STIs 104a, 108a, 112a which have been exposed to reduced stress from the annealing step. A gate oxide layer (not shown) is deposited over a silicon region/planar surface 76a, 76b on the top surface 106 of the substrate 102.

As shown in FIG. 3, a gate conductor material, such as polysilicon, is formed over a gate dielectric 203 into gate structures 202, 218 to form MOSFET gates 206 220 on the top surface 106 of the substrate 102. The gates 202, 218 may be in situ doped during the polysilicon deposition process or doped by implants, or they can contain metal such as TiN or they can be fully silicided. The gate conductor material structures 202, 218 utilize a known deposition process such as, for example, physical vapor deposition, chemical vapor deposition (CVD) or evaporation. The blanket layer of gate conductor material may be doped or undoped. The gate conductor 202 can comprise any conductive material that is typically employed as a gate of a CMOS structure. Illustrative examples of such conductive materials that can be employed as the gate conductor 202 include, but are not limited to: polysilicon, conductive metals or conductive metal alloys, conductive silicides, conductive nitrides, polySiGe, silicide and combinations thereof; including multilayer stacks thereof.

A reoxide layer 201 is formed over the gates 206, 220 using a low temperature thermal oxide and may include slot plane antenna (SPA) oxide (a high pressure and high gas flow rate process with slot plane antenna (SPA) plasma). The reoxide layer 201 may also be formed by using a low temperature oxide or a low temperature nitride about between 400°-500° C. A high temperature annealing following the above method steps according to the present invention must be avoided to maintain the state of low stress in the silicon active regions 76a, 76b and substrate 102 by avoiding thermal expansion of the STI regions 104a, 108a, 112a.

Further referring to FIG. 3, the method according to the present invention further includes implanting halo implants 254, 354 using conventional ion implantation techniques, of like conductivity, in the upper layer 102a of the substrate 102 adjacent the source and drain regions 226, 230, and 234, 238 of respective devices 204, 222 to improve the performance of the semiconductor fabricated. Extentions 258, 358 are also formed by ion implanted in the upper layer of the substrate that underlie respective spacer devices 212 and connect to the respective halo implants and source and drain infusions. Spacers 212 are formed adjacent to the gates/FETs 206, 220 using a low temperature (between 400-500° C.) process, such as, plasma enhanced chemical vapor deposition (PECVD) nitride deposition. The spacer 212 is comprised of an insulator such as an oxide, nitride, oxynitride, or carbon-containing silicon oxide, nitride, oxynitride, and/or any combination thereof. The spacer 212 can be formed by deposition and etching or by thermal techniques.

Source diffusion regions 226, 234 and drain diffusion regions 230, 238 are formed in the upper level of the substrate with the gate structures 206, 220 therebetween. The substrate is then annealed using low-temperatures (below about 700° C.), and then laser annealed. A silicide contact 224 is then optionally formed using conventional methods, on each of the source and drain diffusions 226, 230 and 234, 238. The silicide formation may include using any metal (e.g., Co or Ni) that reacts with silicon to form a silicide in the low temperature range of 300°-500° C.

In a second embodiment according to the present invention, referring to FIGS. 1-4, the method includes all of the process steps up to and including the application of the a reoxide layer 201 shown in FIG. 3. According to the second embodiment of the invention, after forming the gate conductor material structures 202, 218 the nitride spacers 212 are formed, as shown in FIG. 4, using a low temperature (between 400-500° C.) process. Source diffusion regions 226, 234 and drain diffusion regions 230, 238 are then implanted in the upper level 102a of the substrate 102 to form MOSFETS 204, 222. The substrate 102 is annealed using low-temperatures (below 700° C.), and afterwards, the nitride spacers 212 are removed. As shown in FIG. 3, halo implants 254, 354 and extentions 258, 358 are implanted adjacent to the sources 226, 234 and drains 230, 238.

A second forming of the nitride spacer 212 using a low temperature (between 400-500° C.) process is completed in the second embodiment of the invention. The first and second forming of the nitride spacer 212 may include a PECVD nitride deposition process. A laser annealing of the substrate is performed, and a silicide contact formation 224 is provided, as shown in FIG. 3. The low temperature annealing and the laser annealing are used to recrystallize the silicon, and activate the dopants in the halo regions 254, 354, extension regions 258, 358, and source/drain diffusion 226, 230, 234, 238, respectively, and result in a low thermal budget. The silicide formation may include Co or Ni within a range of 300°-500° C. Thus, different process steps and a different order of steps are employed in the second embodiment, e.g., a laser annealing, and two nitride spacer formations, to arrive at the final processed substrate shown in FIG. 4.

Thus, the present invention provides a method and systems for enhancing performance of a semiconductor without substantial increase in costs. The method achieves this by using standard CMOS processes, requires no new masks, or any new materials.

While the present invention has been particularly shown and described with respect to preferred embodiments thereof, it will be understood by those skilled in the art that changes in forms and details may be made without departing from the spirit and scope of the present application. It is therefore intended that the present invention not be limited to the exact forms and details described and illustrated herein, but falls within the scope of the appended claims.

What is claimed is:

1. A method for reducing STI (shallow trench isolation) processing induced stress on a substrate during CMOS (complementary metal-oxide semiconductor) semiconductor fabrication of a MOSFET (metal-oxide-semiconductor field-effect transistors), comprising:

providing at least one well including dopants of a first conductivity in an upper layer of the substrate;

providing at least two STIs in the upper layer of the substrate having one well therebetween;

depositing a first dielectric layer on a top surface of the upper layer of the substrate covering the STIs, the first dielectric layer comprising an oxide material;

depositing a second dielectric layer over the first dielectric layer, said second dielectric layer comprising a nitride material;

annealing the substrate including the at least one well in the upper layer of the substrate using temperatures greater than about 1000° C. to activate the dopants in the at least one well resulting in less stress in the STIs due to the second dielectric layer of nitride material;

stripping the first and second dielectric layers off the top surface of the substrate to provide STIs having been exposed to reduced stress from the annealing step;

forming and patterning a gate structure including a conductive material layer and a dielectric layer over a silicon region on the top surface of the substrate; and forming a reoxide layer over the gate structure using a low temperature oxide process.

2. The method of claim 1 wherein annealing of the at least one well includes rapid thermal annealing (RTA).

3. The method of claim 1 wherein the annealing includes furnace annealing.

4. The method of claim 1 wherein the gate structure contains metal or is partially or fully silicided.

5. The method of claim 1 wherein the gate structure includes polysilicon being in situ doped during polysilicon deposition or doped by implants.

6. The method of claim 1 wherein the reoxide layer includes a low temperature oxide or a low temperature nitride.

7. The method of claim 1 wherein the substrate is a silicon containing material.

8. The method of claim 1 wherein the gate structure is polysilicon or polySiGe.

9. The method of claim 1 further comprising:
   implanting halo implants in the upper layer of the substrate;
   implanting an extention in the upper layer of the substrate that connects the drain and source diffusion regions;
   forming a spacer adjacent to the gate structure using a low temperature process, wherein the low temperature is between about 400-500° C.;
   forming a source and a drain diffusion regions at respective sides of the gate structure;
   annealing the substrate using temperature, wherein the low temperature is below about 700° C.;
   laser annealing the substrate; and
   providing silicide formation, whereby a CMOS semiconductor is fabricated.

10. The method of claim 9 wherein the spacer formation includes PECVD nitride deposition.

11. The method of claim 9 wherein the silicide formation includes using Co or Ni in the temperature range of 300°-500° C.

12. The method of claim 1, wherein forming the reoxide layer includes SPA (slot plane antenna).

13. The method of claim 1 wherein the substrate includes a plurality of STIs and a plurality of wells positioned between the STIs.

14. The method of claim 1 further comprising:
   forming a first nitride spacer adjacent to the gate structure using a low temperature process, wherein the low temperature is between 400-500° C.
   implanting a source and a drain in the upper level of the substrate with the gate structure therebetween;
   annealing the substrate using temperature, wherein the low temperature is below 700° C.;
   removing the nitride spacer;
   implanting halo implants in the upper layer of the substrate;
   implanting an extention in the upper layer of the substrate;
   forming a second nitride spacer adjacent to the gate structure using a low temperature process, wherein the low temperature is between 400-500° C.;
   laser annealing the substrate; and
   providing silicide formation, whereby a CMOS semiconductor is fabricated.

15. The method of claim 14 wherein the first and second spacer formations include a PECVD nitride deposition process.

16. The method of claim 14 wherein the silicide formation includes using Co or Ni within a range of 300°-500° C.

* * * * *